US012540396B2

(12) United States Patent
Cheng et al.

(10) Patent No.: US 12,540,396 B2
(45) Date of Patent: Feb. 3, 2026

(54) SYSTEM AND METHOD FOR MONITORING AND PERFORMING THIN FILM DEPOSITION

(71) Applicant: Taiwan Semiconductor Manufacturing Co., Ltd., Hsinchu (TW)

(72) Inventors: Wen-Hao Cheng, Hsinchu (TW); Yi-Ming Dai, Hsinchu (TW); Yen-Yu Chen, Hsinchu (TW); Hsuan-Chih Chu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/103,761

(22) Filed: Nov. 24, 2020

(65) Prior Publication Data

US 2021/0189561 A1 Jun. 24, 2021

Related U.S. Application Data

(60) Provisional application No. 62/951,972, filed on Dec. 20, 2019.

(51) Int. Cl.
*C23C 16/455* (2006.01)
*C23C 16/44* (2006.01)
(Continued)

(52) U.S. Cl.
CPC .... *C23C 16/45544* (2013.01); *C23C 16/4412* (2013.01); *C23C 16/458* (2013.01); *C23C 16/52* (2013.01)

(58) Field of Classification Search
CPC ........ C23C 16/45525; C23C 16/45527; C23C 16/45529; C23C 16/45531; C23C 16/45534; C23C 16/45536; C23C 16/5538; C23C 16/4554; C23C 16/45542; C23C 16/45544; C23C 16/45546; C23C 16/45548; C23C 16/45551; C23C 16/45553; C23C 16/45555; C23C 16/4412; C23C 16/458; C23C 16/52;
(Continued)

(56) References Cited

U.S. PATENT DOCUMENTS 8,084,011 B2 * 12/2011 Suzuki .................. B82Y 40/00 423/445 B
8,277,560 B2 10/2012 Sakai et al.
(Continued)

FOREIGN PATENT DOCUMENTS

CN 1468975 A 1/2004
CN 1515024 A 7/2004
(Continued)

*Primary Examiner* — Dah-Wei D. Yuan
*Assistant Examiner* — Nga Leung V Law
(74) *Attorney, Agent, or Firm* — Seed IP Law Group

(57) ABSTRACT

A thin film deposition system deposits a thin film on a substrate in a thin film deposition chamber. The thin film deposition system deposits the thin film by flowing a fluid into the thin film deposition chamber. The thin film deposition system includes a byproducts sensor that senses byproducts of the fluid in an exhaust fluid. The thin film deposition system adjusts the flow rate of the fluid based on the byproducts.

20 Claims, 9 Drawing Sheets

(51) Int. Cl.
*C23C 16/458* (2006.01)
*C23C 16/52* (2006.01)

(58) Field of Classification Search
CPC ........ C23C 16/45512; C23C 16/45561; H01L 21/02181; H01L 21/0228
See application file for complete search history.

(56) References Cited

U.S. PATENT DOCUMENTS

| | | | | |
|---|---|---|---|---|
| 9,607,908 | B1 | 3/2017 | Takeda | |
| 10,208,378 | B2 | 2/2019 | Komeno et al. | |
| 2004/0266011 | A1* | 12/2004 | Lee | C23C 16/52 436/5 |
| 2005/0061245 | A1 | 3/2005 | Kim | |
| 2005/0145333 | A1 | 7/2005 | Kannan et al. | |
| 2006/0207630 | A1* | 9/2006 | Sakai | C23C 16/52 156/345.43 |
| 2006/0219634 | A1* | 10/2006 | Parekh | C01D 7/07 210/321.87 |
| 2007/0134823 | A1 | 6/2007 | Yang | |
| 2011/0017135 | A1 | 1/2011 | Murata | |
| 2013/0193108 | A1 | 8/2013 | Zheng et al. | |
| 2013/0237064 | A1 | 9/2013 | Kirikihira et al. | |
| 2018/0057937 | A1* | 3/2018 | Lee | C23C 16/4412 |

FOREIGN PATENT DOCUMENTS

| | | | | |
|---|---|---|---|---|
| CN | 1579011 | A | | 2/2005 |
| CN | 107610995 | A | | 1/2018 |
| CN | 107641796 | A | | 1/2018 |
| JP | 2004103689 | A | | 4/2004 |
| JP | 2009088219 | A | * | 4/2009 |
| TW | 200307055 | A | | 12/2003 |
| TW | 200951245 | A | | 12/2009 |
| TW | 201810472 | A | | 3/2018 |
| TW | 201825707 | A | | 7/2018 |

* cited by examiner

SYSTEM AND METHOD FOR MONITORING AND PERFORMING THIN FILM DEPOSITION

BACKGROUND

Technical Field

The present disclosure relates to the field of thin film deposition.

Description of the Related Art

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

To continue decreasing the size of features in integrated circuits, various thin film deposition techniques are implemented. These techniques can form very thin films. However, thin film deposition techniques also face serious difficulties in ensuring that the thin films are properly formed.

DETAILED DESCRIPTION

Figure 1:
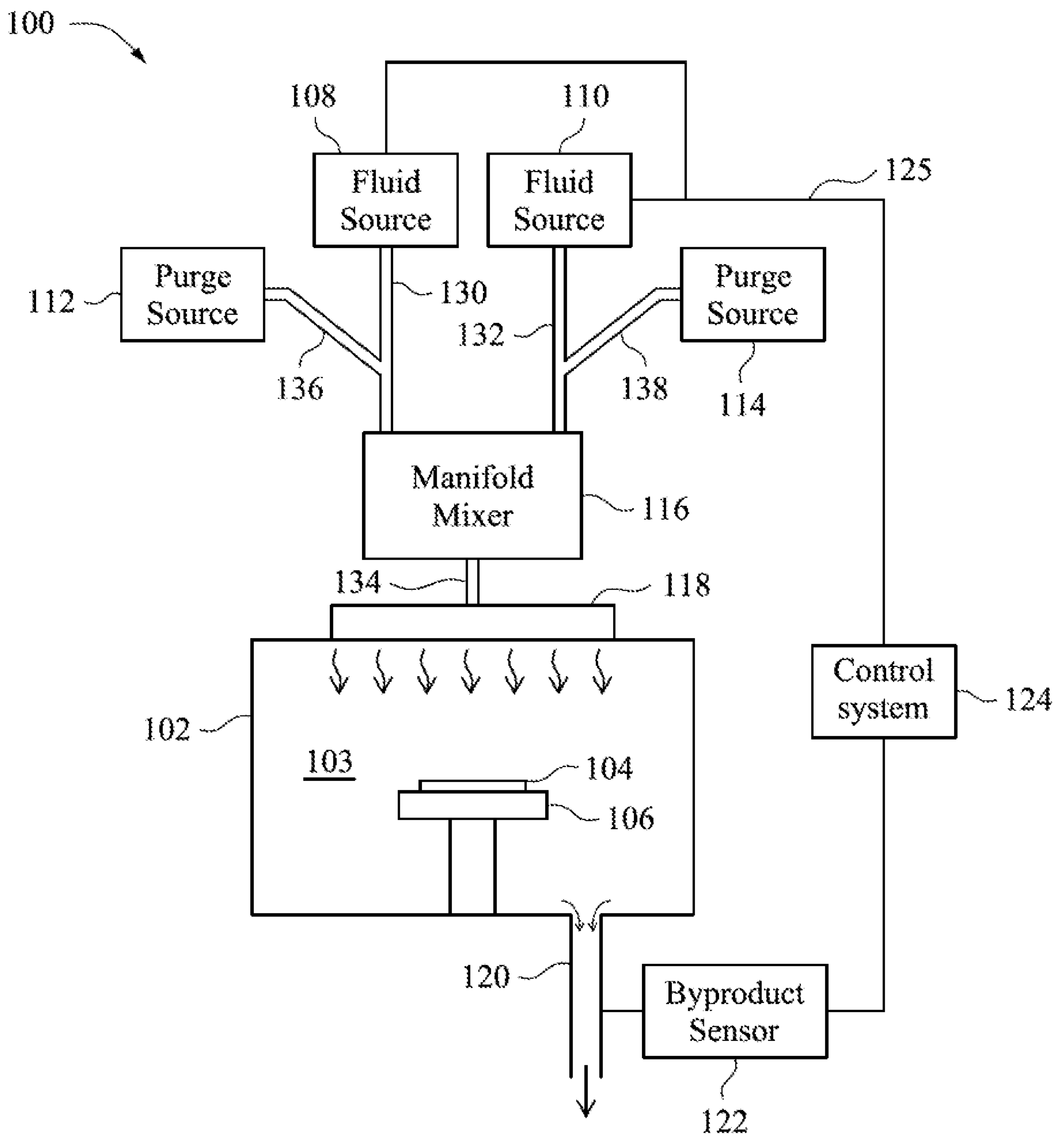
FIG. 1 is an illustration of a thin film deposition system, according to one embodiment.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide thin films of reliable thickness and composition. Embodiments of the present disclosure accurately monitor the flow of deposition fluids during thin film deposition processes and adjust the flow of fluids in real time to ensure proper formation of the thin films. Embodiments of the present disclosure monitor the flow of the fluids by detecting byproducts of the deposition fluids in exhaust fluids flowing from the thin film deposition chamber. Embodiments of the present disclosure can also determine whether a deposition fluid source is empty or nearly empty and needs to be refilled or replaced.

Accordingly, embodiments of the present disclosure provide many benefits. In case that flow rates are not sufficient or if fluid sources are empty during thin film deposition processes, thin films may not be formed properly. This may result in the scrapping of entire batches of semiconductor wafers at great expense in terms of time and resources. Embodiments of the present disclosure overcome these drawbacks by accurately monitoring the flow of deposition fluids in real time, by adjusting fluid flows in real time, and by detecting if fluid levels are low or entirely depleted in fluid sources and refilling or replacing the fluid sources.

FIG. 1 is a block diagram of a thin film deposition system 100, according to one embodiment. The thin film deposition system 100 includes a thin film deposition chamber 102 including an interior volume 103. A support 106 is positioned within the interior volume 103 and is configured to support a substrate 104 during a thin film deposition process. The thin film deposition system 100 is configured to deposit a thin film on the substrate 104.

In one embodiment, the thin film deposition system 100 includes a first fluid source 108 and a second fluid source 110. The first fluid source 108 supplies a first fluid into the interior volume 103. The second fluid source 110 supplies a second fluid into the interior volume 103. The first and second fluids both contribute in depositing a thin film on the substrate 104.

In one embodiment, the thin film deposition system 100 is an atomic layer deposition (ALD) system that performs ALD processes. The ALD processes form a seed layer on the substrate 104. The seed layer is selected to chemically interact with a first precursor gas, such as the first fluid supplied by the first fluid source 108. The first fluid is supplied into the interior volume 103. The first fluid reacts with the seed layer to form new compounds with each atom or molecule of the surface of the seed layer. The new compounds include atoms that were previously part of the seed layer and atoms that were previously part of the first fluid. The reaction of the seed layer with the first fluid results in new compounds that were not present before the reaction. This corresponds to the deposition of a first layer, or a first step in deposition of the first layer of the thin film.

The reaction between the seed layer and the first fluid may also bring one or more byproduct(s). After flowing the first fluid for a selected amount of time, a purge gas is supplied into the interior volume to purge the byproducts of the first fluid, as well as the unreacted portions of the first fluid, from the interior volume 103 through the exhaust channel 120. As will be described in more detail below, the purge fluid can flow from either or both of the purge sources 112 and 114.

After the first fluid has been purged, a second precursor gas, such as the second fluid is supplied into the interior volume from the second fluid source 110. The second fluid reacts with the first layer to form a second layer on top of the first layer of the thin film. Alternatively, the flow of the second fluid can complete the formation of the first layer of the thing film by reacting with the first portion of the first layer. As is described in more detailed below, the thin film is made of several layers. Each layer, or pair of layers, is formed by a cycle of flowing the first fluid, purging, flowing the second fluid, and purging again. The total thickness of the thin film is based on the number of cycles. This reaction also result in byproducts. A purge gas is again supplied into the interior volume 103 to purge the byproducts of the second fluid, as well as the unreacted portions of the second fluid, from the interior volume 103. This sequence of supplying the first fluid, purging, supplying the second fluid, and purging again is repeated until the thin film has a selected thickness. As will be described in more detail below, the purge gas can be flowed from either or both of the purge sources 112 and 114.

In some cases, the thin film deposition process can be very sensitive to concentrations or flow rates of the first and second fluids at the various stages during the thin film deposition processes. If the concentration or flow rate of the first or second fluid is not sufficiently high at particular stages, then the thin film may not be formed properly on the substrate 104. For example, the thin film may not have a desired composition or thickness if the concentration or flow rate of the first or second fluid is not sufficiently high.

The amount of fluid remaining in the first and second fluid sources 108 and 110 can affect the flow rate or concentration of the first and second fluids in the deposition chamber 102. For example, if the first fluid source 108 has a low amount of the first fluid remaining, then the flow rate of the first fluid from the first fluid source 108 may be low. If the first fluid source 108 is empty and does not include any more of the first fluid, there will be no flow of the first fluid from the first fluid source 108. The same considerations apply to the second fluid source 110. Low or nonexistent flow rates can result in a thin film that is not properly formed.

In one embodiment, the thin film deposition system 100 includes an exhaust channel 120 communicatively coupled to the interior volume 103 of the deposition chamber 102. Exhaust products from the thin film deposition process flow out of the interior volume 103 via the exhaust channel 120. The exhaust products can include unreacted portions of the first and second fluids, byproducts of the first and second fluids, purge fluids used to purge the interior volume 103, or other fluids or materials.

The thin film deposition system 100 includes a byproduct sensor 122 coupled to the exhaust channel 120. The byproduct sensor 122 is configured to sense the presence and/or concentration of byproducts from one or both of the first and second fluids in the exhaust fluids flowing through the exhaust channel 120. The first and second fluids interact together to form the thin film on the substrate 104. The deposition process also results in byproducts from the first and second fluids. The concentration of these byproducts is indicative of the concentration or flow rate of one or both of the first and second fluids during deposition. The byproduct sensor 122 senses the concentration of the byproducts in the exhaust fluids flowing from the interior volume 103 through the exhaust channel 120.

In one embodiment, the thin film deposition system 100 includes a control system 124. The control system 124 is coupled to the byproduct sensor 122. The control system 124 receives the sensor signals from the byproduct sensor 122. The sensor signals from the byproduct sensor 122 are indicative of the concentration of byproducts of one or both of the first and second fluids in the exhaust fluid. The control system 124 can analyze the sensor signals and determine a flow rate or concentration of one or both of the first and second fluid sources 108, 110 during particular stages of the deposition process. The control system 124 can also determine a remaining level of the first fluid in the first fluid source 108 and/or of the second fluid in the second fluid source 110.

The control system 124 can include one or more computer readable memories. The one or more memories can store software instructions for analyzing sensor signals from the byproduct sensor 122 and for controlling various aspects of the thin film deposition system 100 based on the sensor signals. The control system 124 can include one or more processors configured to execute the software instructions.

The control system 124 can include communication resources that enable communication with the byproduct sensor 122 and other components of the thin film deposition system 100.

In one embodiment, the control system 124 is communicatively coupled to the first and second fluid sources 108, 110 via one or more communication channels 125. The control system 124 can send signals to the first fluid source 108 and the second fluid source 110 via the communication channels 125. The control system 124 can control functionality of the first and second fluid sources 108, 110 responsive, in part, to the sensor signals from the byproduct sensor 122.

In one embodiment, the byproduct sensor 122 senses a concentration of byproducts in the exhaust fluid. The byproduct sensor 122 cents sensor signals to the control system 124. The control system 124 analyzes the sensor signals and determines that a recent flow rate of the first fluid from the first fluid source 108 was lower than expected, based on the sensor signals from the byproduct sensor 122. The control system 124 sends control signals to the first fluid source 108 commanding the first fluid source 108 to increase a flow rate of the first fluid during a subsequent deposition cycle. The first fluid source 108 increases the flow rate of the first fluid into the interior volume 103 of the deposition chamber 102 responsive to the control signals from the control system 124. The byproduct sensor 122 can again generate sensor signals indicative of the concentration of byproducts of the first fluid during the subsequent deposition cycle. The control system 124 can determine whether the flowrate of the first fluid needs to be adjusted based on the sensor signals from the byproduct sensor 122. In this way, the byproduct sensor 122, the control system 124, and the first fluid source 108 makeup a feedback loop for adjusting the flowrate of the first fluid. The control system 124 can also control the second fluid source 110 in the same manner as the first fluid source 108. Furthermore, the control system 124 can control both the first fluid source 108 and the second fluid source 110.

In one embodiment, the thin film deposition system 100 can include one or more valves, pumps, or other flow control mechanisms for controlling the flow rate of the first fluid from the first fluid source 108. These flow control mechanisms may be part of the fluid source 108 or may be separate from the fluid source 108. The control system 124 can be communicatively coupled to these flow control mechanisms or to systems that control these flow control mechanisms. The control system 124 can control the flowrate of the first fluid by controlling these mechanisms. The thin film deposition system 100 may include valves, pumps, or other flow control mechanisms that control the flow of the second fluid from the second fluid source 110 in the same manner as described above in reference to the first fluid and the first fluid source 108.

In one embodiment, the control system 124 can determine how much of the first fluid remains in the first fluid source 108 based on the sensor signals from the byproduct sensor 122. The control system 124 may analyze the sensor signals to determine that the first fluid source 108 is empty or is nearly empty. The control system 124 can provide an indication to technicians or other personnel indicating that the first fluid source 108 is empty or nearly empty and that the first fluid source 108 should be refilled or replaced. These indications can be displayed on a display, can be transmitted via email, instant message, or other communication platforms that enable technicians or other experts or systems to understand that one or both of the first and second fluid sources 108, 110 are empty or nearly empty.

In one embodiment, the thin film deposition system 100 includes a manifold mixer 116 and a fluid distributor 118. The manifold mixer 116 receives the first and second fluids, either together or separately, from the first fluid source 108 and the second fluid source 110. The manifold mixer 116 provides either the first fluid, the second fluid, or a mixture of the first and second fluids to the fluid distributor 118. The fluid distributor 118 receives one or more fluids from the manifold mixer 116 and distributes the one or more fluids into the interior volume 103 of the thin film deposition chamber 102.

In one embodiment, the first fluid source 108 is coupled to the manifold mixer 116 by a first fluid channel 130. The first fluid channel 130 carries the first fluid from the fluid source 108 to the manifold mixer 116. The first fluid channel 130 can be a tube, pipe, or other suitable channel for passing the first fluid from the first fluid source 108 to the manifold mixer 116. The second fluid source 110 is coupled to the manifold mixer 116 by second fluid channel 132. The second fluid channel 132 carries the second fluid from the second fluid source 110 to the manifold mixer 116.

In one embodiment, the manifold mixer 134 is coupled to the fluid distributor 118 by a third fluid line 134. The third fluid line 134 carries fluid from the manifold mixer 116 to the fluid distributor 118. The third fluid line 134 may carry the first fluid, the second fluid, a mixture of the first and second fluids, or other fluids, as will be described in more detail below.

The first and second fluid sources 108, 110 can include fluid tanks. The fluid tanks can store the first and second fluids. The fluid tanks can selectively output the first and second fluids.

In one embodiment, the thin film deposition system 100 includes a first purge source 112 and the second purge source 114. The first purge source is coupled to the first fluid line 130 by first purge line 136. The second purge source is coupled to the fluid line 132 by second purge line 138. In practice, the first and second purge sources 112 and 114 may be a single purge source.

In one embodiment, the first and second purge sources 112, 114 supply a purging gas into the interior volume 103 of the deposition chamber 102. The purge fluid is a fluid selected to purge or carry the first fluid, the second fluid, byproducts of the first or second fluid, or other fluids from the interior volume 103 of the deposition chamber 102. The purge fluid is selected to not interact with the substrate 104, the thin film layer deposited on the substrate 104, the first and second fluids, and byproducts of this first and second fluid. Accordingly, the purge fluid may be an inert gas including, but not limited to, Ar or $N_2$. In one embodiment, the first and second purge sources include a same purge fluid. Alternatively, the purge sources 112 and 114 can include different purge fluid.

After a cycle of flowing one or both of the first or second fluids into the interior volume 103, the thin film deposition system 100 purges the interior volume 103 by flowing the purge fluid into the interior volume 103 and through the exhaust channel 120. The control system 124 can be communicatively coupled to the first and second purge sources 112, 114, or flow mechanisms that control the flow of the purge fluid from the first and second purge sources 112, 114. The control system 124 can purge the interior volume 103 after or between deposition cycles, as will be explained in more detail below.

In one embodiment, the purge source 112 can supply the purge gas after the fluid source 108 supplies the first fluid. The purge source 114 can supply the purge gas after the fluid source 110 supplies the first fluid. In one embodiment, the purge source 112 and purge source 114 both supply the purge gas after the fluid source 108 supplies the first fluid and after the fluid source 110 supplies the second fluid.

In one embodiment, the first and second purge lines 136, 138 join the first and second fluid lines 130, 132 at selected angles. The angles are selected to ensure that the purge fluid flows toward the manifold mixer 116 and not toward the first or second fluid sources 108, 110. Likewise the angle helps ensure that the first and second fluids will flow from the first and second fluid sources 108, 110 toward the manifold mixer 116 and not toward the first and second purge sources 112, 114.

While FIG. 1 illustrates a first fluid source 108 and a second fluid source 110, in practice the thin film deposition system 100 can include other numbers of fluid sources. For example, the thin film deposition system 100 may include only a single fluid source or more than two fluid sources. Accordingly, the thin film deposition system 100 can include a different number than two fluid sources without departing from the scope of the present disclosure.

Furthermore, the thin film deposition system 100 has been described, in one embodiment, as an ALD system, the thin film deposition system 100 can include other types of deposition systems without departing from the scope of the present disclosure. For example, the thin film deposition system 100 can include a chemical vapor deposition system, a physical vapor deposition system, a sputtering system, or other types of thin film deposition systems without departing from the scope of the present disclosure. A byproduct sensor 122 can be utilized to determine the flowrate or concentration of deposition fluids as well as how much deposition fluid remains in a deposition fluid source.

Figure 2A:
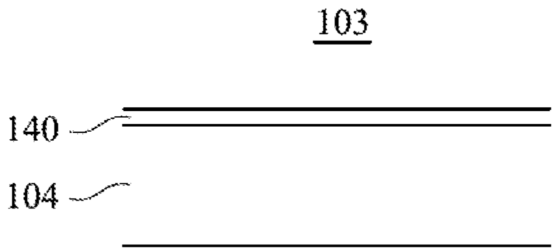
FIGS. 2A-2C illustrate a substrate during successive steps of an atomic layer deposition process, according to one embodiment.
Figure 2B:
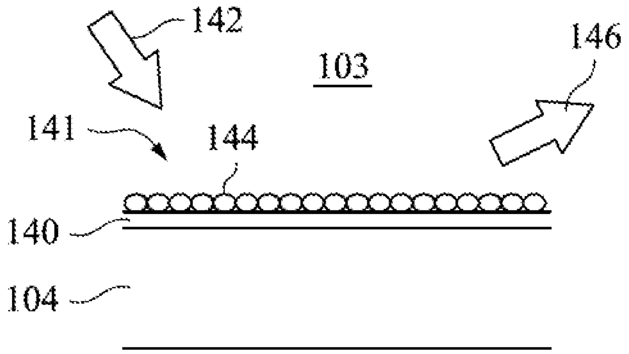
Figure 2C:
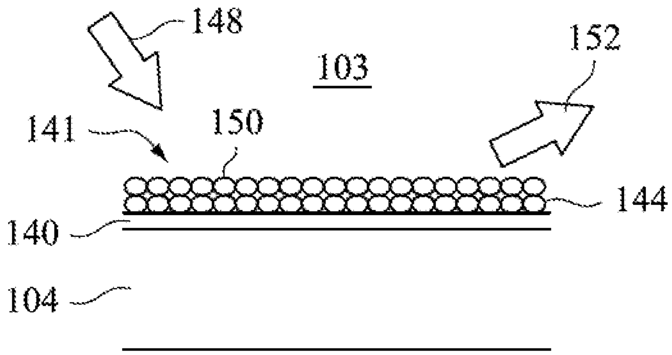

FIGS. 2A-2C illustrate a substrate 104 during successive steps of an ALD process, according to one embodiment. The description of FIGS. 2A-2C will be made with reference to FIG. 1. Accordingly, the ALD process is performed, in one example, by the thin film deposition system 100 of FIG. 1.

In FIG. 2A, a substrate 104 is positioned in an interior volume 103 of a thin film deposition chamber 102. A seed layer 140 is positioned on a top surface of the substrate 104. As will be described in more detail below, the seed layer 140 is of a composition selected to facilitate the beginning of an ALD process. The material of the seed layer 140 is selected based on the materials or fluids that will be used in the ALD process to produce the thin film. In particular, the seed layer 140 is selected to bond with a material for a first layer of the ALD.

In one embodiment, the substrate 104 is a semiconductor wafer. The ALD process is one of a large number of semiconductor processes that will be performed on the semiconductor wafer. These semiconductor processes combined to form and pattern various layers of materials including semiconductor materials, dielectric materials, and conductive materials. After the semiconductor processes have been performed, the semiconductor wafer will be diced into a plurality of individual integrated circuit dies. Accordingly, ALD process described in relation to FIGS. 2A-2C results in a thin film layer that will be part of various integrated circuit dies.

In FIG. 2B a first layer 144 of a thin film 141 is deposited on the seed layer 140. In particular, a first fluid 142 is flowed into the interior volume 103 of the thin film deposition chamber 102. The first fluid 142 can be provided via the first fluid source 108 of FIG. 1. The first fluid 142 includes a precursor or reactant that reacts with the seed layer 140. In particular, each surface atom or molecule of the seed layer 140 reacts with the precursor or reactant in the first fluid 142. The result is that a new molecule or compound is formed at each surface site of the seed layer 140. Accordingly, a first layer 144 of the thin film 141 is formed on the seed layer 140. The first layer 144 has a thickness of one molecule or compound.

Although FIG. 2B illustrates a first layer 144 forming on top of the seed layer 140, in practice, the first layer 144 may incorporate the seed layer 140. The first layer 144 may correspond to the surface atoms or molecules of the seed layer 140 reacting with the precursor or reactant in the first fluid 142 in order to form new compounds from the seed layer 140 and the precursor or reactant in the first fluid 142. Specific examples of materials of the seed layer in the first fluid 142 are given in relation to FIGS. 4 and 5.

In one embodiment, the reaction of the first fluid 142 with the seed layer 140 results in byproducts 146. The byproducts 146 are the byproducts of the reaction between the seed layer 140 and the first fluid 142. When the first fluid 142 reacts with and combines with the seed layer 140, new compounds or molecules are formed from the reaction of the material of the first fluid 142 and the seed layer 140. Some of the new compounds make up the first layer 14. Other of the new compounds are byproducts 146. Accordingly, the first fluid 142 may include a first type of molecule. The first type of molecule reacts with the seed layer 140 and forms a second type of molecule and the third type of molecule. The second type of molecule makes up the first layer 144 of the thin film 141. The third type of molecule is the byproducts 146.

In FIG. 2C a second layer 150 of the thin film 141 is deposited on the first layer 144. In particular, a second fluid 148 is flowed into the interior volume 103 of the thin film deposition chamber 102. The second fluid 148 can be provided via the second fluid source 110 of FIG. 1. The second fluid 148 includes a precursor or reactant that reacts with the first layer 144. In particular, each surface atom or molecule of the first layer 144 reacts with the precursor or reactant in the second fluid 148. The result is that a new molecule or compound is formed at each surface site of the first layer 144. Accordingly, a second layer 150 of the thin film 141 is formed on the first layer 144. The first layer 144 has a thickness of one molecule or compound.

Although FIG. 2C illustrates deposition of a second layer 150 on top of the first layer 144, in practice, the second layer 150 may incorporate the first layer 144. The second layer 150 may correspond to the surface atoms or molecules of the first layer 144 reacting with the precursor or reactant in the second fluid 148 in order to form new compounds from the first layer 144 and the precursor or reactant in the second fluid 148. Accordingly, the process illustrated in FIGS. 2A-2C may result in a single layer of the thin film 141. The first fluid transforms the seed layer, then the second fluid further transforms the seed layer. Specific examples of materials of the second fluid 148 are given in relation to FIGS. 4 and 5.

In one embodiment, the reaction of the second fluid 148 with the first layer 144 results in byproducts 152. The byproducts 152 are the byproducts of the reaction between the first layer 144 and the second fluid 148. When the second fluid 148 reacts with and combines with the first layer 144, new compounds or molecules are formed from the material of the second fluid 148 and the first layer 144. Some of the new compounds make up the second layer 150. Other of the new compounds are byproducts 152. Accordingly, the second fluid 148 may include a first type of molecule. The first type of molecule reacts with the first layer 144 and forms a second type of molecule and a third type of molecule. The second type of molecule makes up the second layer 150 of the thin film 141. The third type of molecule is the byproducts 152.

The process shown in relation to FIGS. 2A-2C can be repeated multiple times to fully form the thin film 141 on the substrate 104. Each deposition cycle results in a new layer of the thin film 141 deposited on the previous layer. The overall thickness of the thin film 141 can be tightly controlled by selecting the number of deposition cycles. Because each deposition cycle results in a new layer (or two new layers), the total number of layers of the thin film 141, and thus, the total thickness, is based directly on the number of deposition cycles.

As described previously in relation to FIG. 1, is possible that the flow of either the first fluid 142 or the second fluid 148 could be unduly low. The thin film deposition system 100 utilizes the byproduct sensor 122 senses the concentration of the byproducts 146 and/or 152. The control system 124 can determine the concentration or flow rate of the first fluid 142 and/or the second fluid 148 based on the concentration of the byproducts 146 and/or 152. The control system 124 can then take actions to increase the flow rate or alert personnel or other system components that the first or second fluid source 108, 110 is low or empty.

Figure 3:
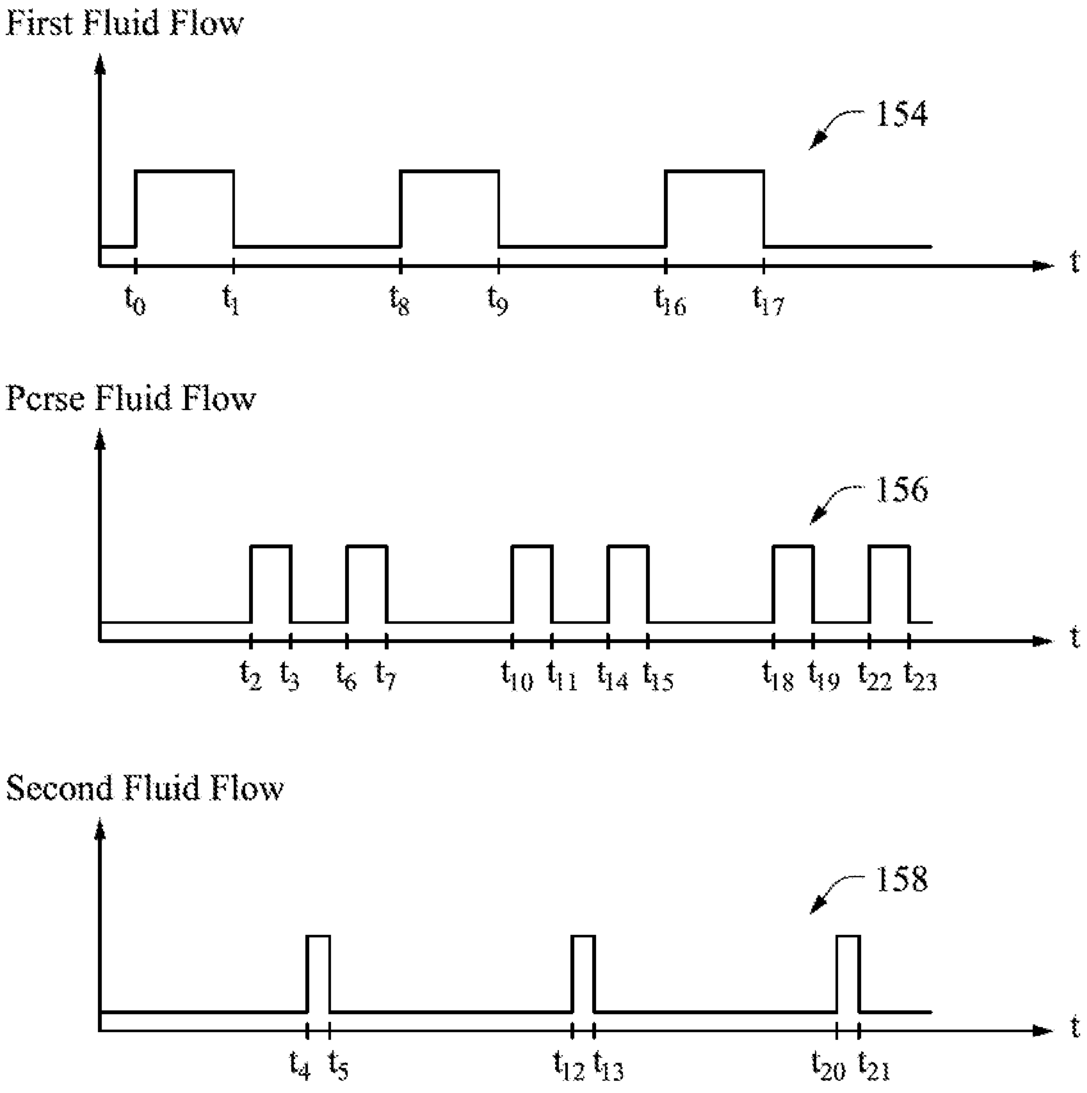
FIG. 3 is a plurality of graphs of fluid flow during an atomic layer deposition process.

FIG. 3 illustrates a plurality of fluid flow graphs 154, 156, and 158, according to one embodiment. The first graph 154 illustrates a flow of a first fluid 142. The second graph 156 illustrates a flow of the purge fluid. The third draft 158 illustrates the flow of a second fluid 148.

At time T0, the first fluid 142 begins to flow into the interior volume 103 of the thin film deposition chamber 102. At time T1 the first fluid stops flowing. At time T2, the purge fluid begins to flow into the interior volume 103 of the thin film deposition chamber 102. The purge fluid can flow from the purge source 112 or both the purge source 112 and the purge source 114. At time T3, the purge fluid stops flowing. At time T4, the second fluid 148 begins to flow into the interior volume 103 of the thin film deposition chamber 102. At time T5, the second fluid 148 stops flowing. At time T6 the purge fluid begins flowing again. The purge fluid can flow from the purge source 114 or both the purge source 112 and the purge source 114. At time T7, the purge fluid stops flowing.

In one embodiment, the process between times T0 and T7 corresponds to a single deposition cycle. This process corresponds to the process illustrated in FIGS. 2A-2C. The flow of the purge fluid is omitted in FIGS. 2A-2C, but the purge fluid can flow from the purge source 112, the purge source 114, or both the purge source 112 and purge source 114 as illustrated in FIG. 1. The purge fluid purges the interior volume 103 of remaining portions of the first and second fluids 142, 148 and their byproducts 146, 152. Each cycle of flow of the first and second fluids 142, 148 results in a layer of the thin film 141, or a pair of layers as the case may be.

In one embodiment, a second cycle of the deposition process begins at time T8 and ends at time T15. A third cycle of the deposition process begins at time T16 and ends at time T23. FIG. 3 illustrates three deposition cycles. However, the ALD process can include many more deposition cycles than three. In one example, and ALD process may include 20-25 deposition cycles, though more or few deposition cycles can be used without departing from the scope of the present disclosure.

Figure 4:
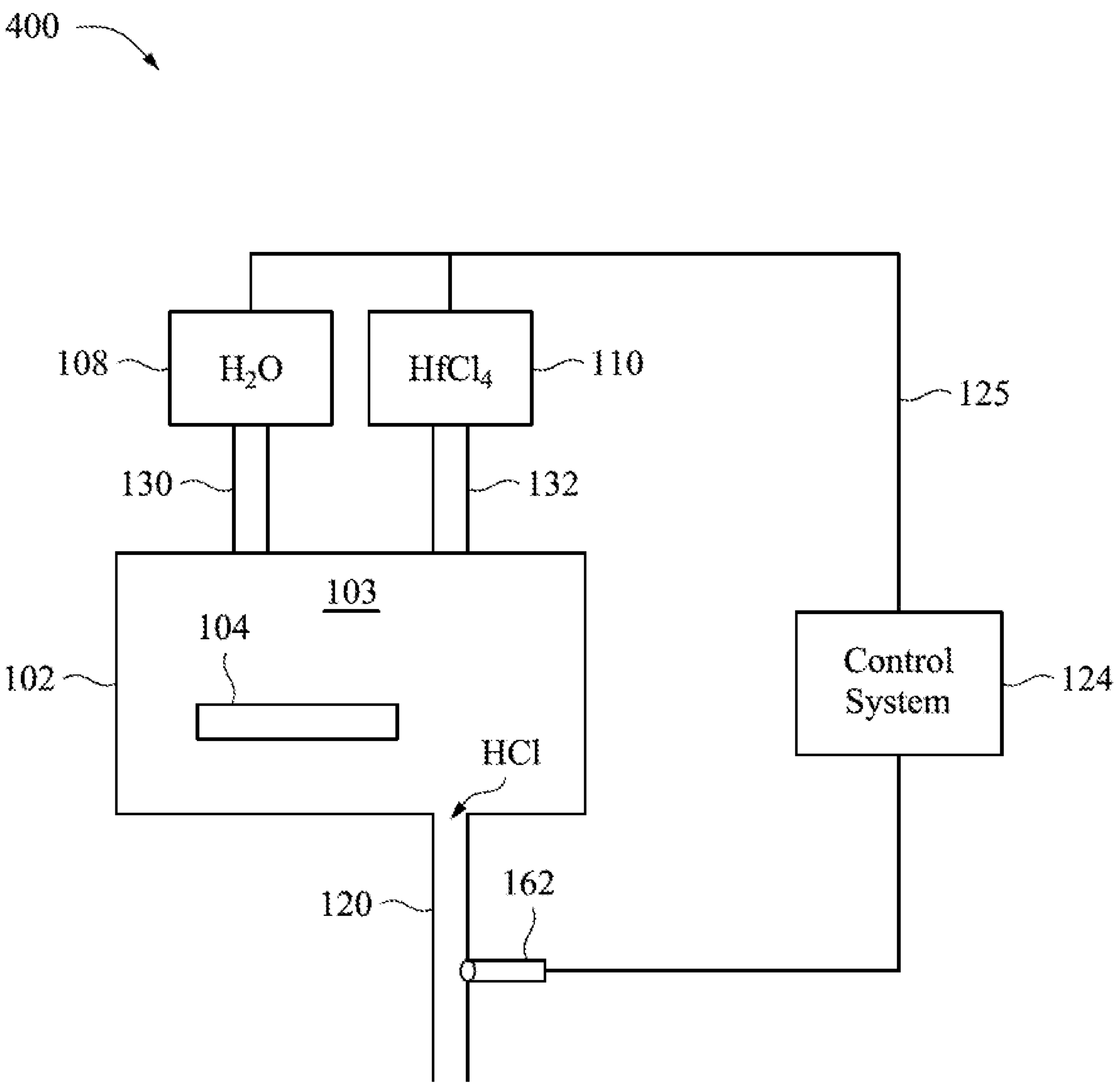
FIG. 4 is an illustration of an atomic layer deposition system, according to one embodiment.

FIG. 4 is an illustration of a thin film deposition system 400, according to one embodiment. The thin film deposition system 400 is similar in many ways to the thin film deposition system 100 of FIG. 1. The thin film deposition system 400 may include components shown and described in relation to the thin film deposition system 100 of FIG. 1, but that are not shown in FIG. 4.

The thin film deposition system 400 includes a thin film deposition chamber 102 including an interior volume 103 and the substrate positioned within the interior volume 103. The thin film deposition system 400 includes a first fluid source 108 and the second fluid source 110 communicatively coupled to the interior volume 103 by a first fluid line 103 and a second fluid line 132. The thin film deposition system further includes an exhaust channel 120 communicatively coupled to the interior volume 103 and a pH sensor 162 coupled to the exhaust channel 120.

In one embodiment, the first fluid source 108 includes $H_2O$ in gas or liquid form. The second fluid source 110 includes $HfCl_4$ fluid. The HfCl4 fluid may be a gas. The first and second fluids can be used to form a hafnium based high K gate dielectric layer for CMOS transistors.

An ALD process using the thin film deposition system 400 will be described with reference to FIG. 3. Between times TO and T1, the first fluid ($H_2O$) output from the first fluid source 108 into the interior volume 103. In one example, the first fluid flows for about 10 seconds, though other lengths of time can be used without departing from the scope of the present disclosure.

Between times T2 and T3, a purge gas is output from a purge source (not shown in FIG. 4), such as either or both of the purge sources 112 and 114 of FIG. 1, into the interior volume 103. The purge gas may include nitrogen molecules ($N_2$) or another nonreactive gas. In one example, purge gas flows for about three seconds, though other lengths of time can be used without departing from the scope of the present disclosure.

Between times T4 and T5, $HfCl_4$ is output from the second fluid source 110 into the interior volume 103. In one example, the $HfCl_4$ flows for about one second, though other lengths of time can be used without departing from the scope of the present disclosure. Between times T6 and T7, the purge gas flows. The purge gas can flow from a purge source, such as either or both of the purge sources 112 and 114 of FIG. 1.

In one embodiment, the seed layer 141 shown in FIG. 2B includes functionalized oxygen atoms. When the first fluid ($H_2O$) is provided into the interior volume 103, the $H_2O$ molecules react with the functionalized oxygen atoms of the seed layer to form OH from each functionalized oxygen atom. The byproducts of this reaction, as well as any remaining $H_2O$ molecules, are purged from the interior volume 103 via the exhaust channel 120 by flow of the purge gas. The $HfCl_4$ is then provided into the interior volume 103. The $HfCl_4$ reacts with the OH compounds to form, on the substrate 104, Hf—O—$HfCl_3$. One of the byproducts of this reaction is HCl. The purge gas flows again, followed by $H_2O$. The $H_2O$ reacts with the Hf—O—$HfCl_3$ to form, on the substrate 104, Hf—$OH_3$. A byproduct of this reaction is HCl. The purge gas then flows again. The cycle can be repeated multiple times, as described above.

The pH sensors 162 senses the pH of the exhaust gases being purged via the exhaust channel 120. The pH of the exhaust gases is indicative of the flow rate, concentration, or remaining supply of $HfCl_4$ in the second fluid source 110.

In one embodiment, when the purge gas flows after flowing $H_2O$, the exhaust gas will include the byproduct HCl, as described above, and unreacted $H_2O$. The byproduct HCl disassociates in the presence of the unreacted $H_2O$. The result is that H+ and Cl− are present in the exhaust gas. H+ is strongly acidic.

In one embodiment, the pH sensor is positioned to sense the pH of the exhaust fluid flowing through the exhaust channel 120. The pH sensor senses the acidic H+ from the disassociated byproduct HCl. Accordingly, the pH is indicative of the concentration of H+ in the exhaust fluid. The concentration of H+ is indicative of the amount of byproduct HCl produced. The amount of byproduct HCl is indicative of the flow rate or concentration of $HfCl_4$ during the periods when $HfCl_4$ is provided to the interior volume 103. Accordingly, the pH of the exhaust fluid is indicative of the flow rate of $HfCl_4$, which can in turn be indicative of the amount of $HfCl_4$ remaining in the second fluid source 110.

In another embodiment, one of the byproducts can include $NH_3$. The byproduct $NH_3$ disassociates in the presence of the unreacted $H_2O$ to form $NH_4$+ and OH−. OH− is highly alkaline. The pH sensor 162 can sense the alkalinity of the OH− in the exhaust fluid.

The pH sensor 162 can include a portion that protrudes into the exhaust channel 120 in order to sense the pH of exhaust fluids. Alternatively, a portion of the exhaust fluid can be drafted out of the exhaust channel 120 into a separate channel from which the pH sensor 162 can sense the pH of the exhaust fluids.

In one embodiment, the pH sensor 162 sends sensor signals to the control system 124. The control system 124 can estimate, based on the sensor signals, a flow rate of the $HfCl_4$ or a current remaining supply of $HfCl_4$ in the second fluid source 110. The control system 124 can then take action to adjust the flow rate or request that the fluid source 110 be refilled with $HfCl_4$.

Figure 5:
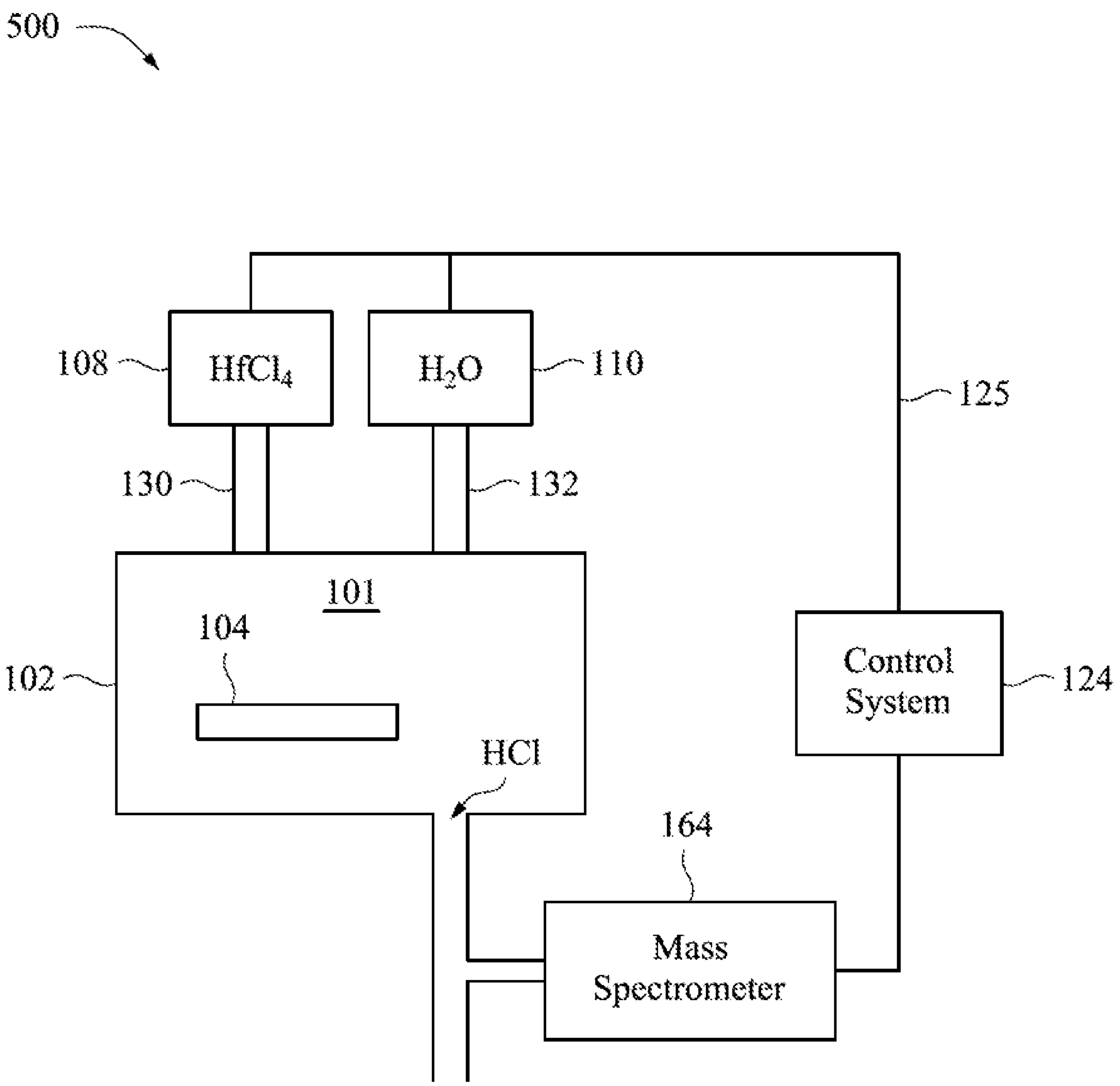
FIG. 5 is an illustration of an atomic layer deposition system, according to one embodiment.

FIG. 5 is an illustration of a thin film deposition system 500, according to one embodiment. The thin film deposition system 500 is similar in many ways to the thin film deposition system 400 of FIG. 4.

In one embodiment, the thin film deposition system 500 includes a mass spectrometer 164. The mass spectrometer receives atoms, molecules and compounds from the exhaust fluid in the exhaust channel. The mass spectrometer 164 can receive the atoms, molecules, and compounds via an aperture in the exhaust channel 120 that enables some of the atoms, molecules, and compounds to flow into the mass spectrometer 164.

In one embodiment, the mass spectrometer 164 generates sensor signals indicative of the types and concentrations of various atoms, molecules, and compounds in the exhaust fluid. The mass spectrometer 164 can output the sensor signals to the control system 124. The control system 124 can determine or estimate the concentration of various byproducts within the exhaust fluid. Based on this information, the control system 124 can adjust the flow of the first or second fluids or can determine that the first or second fluid sources 108, 110 are empty or contain low remaining amounts of the first and second fluids.

Figure 6:
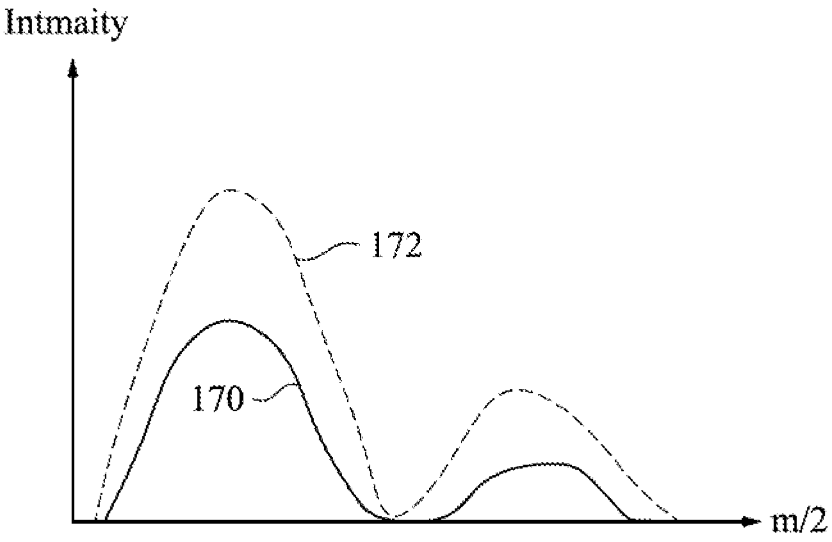
FIG. 6 is a graph illustrating the intensity compounds in an exhaust fluid, according to one embodiment.

FIG. 6 is a graph illustrating the intensity or concentration of various molecules or compounds in the exhaust fluid, according to one embodiment. Particular types of ions will have a characteristic mass to charge ratio (m/z). The mass spectrometer 164 generates sensor signals indicating the intensity or concentration of particles having particular mass to charge ratios. The control system 124 can generate a graph 170 of the intensity or concentration of particles having particular mass to charge ratios based on the sensor signals. The control system 124 can compare the graph 172. The reference graph 172 is an indication of the expected or desired intensity of particles present in the exhaust fluid. The control system 124 can compare the graph 170 to the reference graph 172 in order to determine if the concentration of certain types of compounds in the byproducts are at expected levels. The control system 124 can take action responsive to the comparison.

The control system 124 can include graphs or reference data for other types of sensor data. For example, the control system 124 can include graphs or reference data for pH sensors signals in order to compare pH sensor signals to reference data.

In one embodiment, the control system 124 can estimate and expected thickness of the thin film 141 based on the concentration of byproducts in the exhaust fluid. For example, the control system 124 can include test data indicating the thickness of thin films versus the concentration of various byproducts. The control system 124 can then make estimates about the thickness of the thin film 141 based on the concentration of byproducts sensed by byproduct sensor 122.

Figure 7:
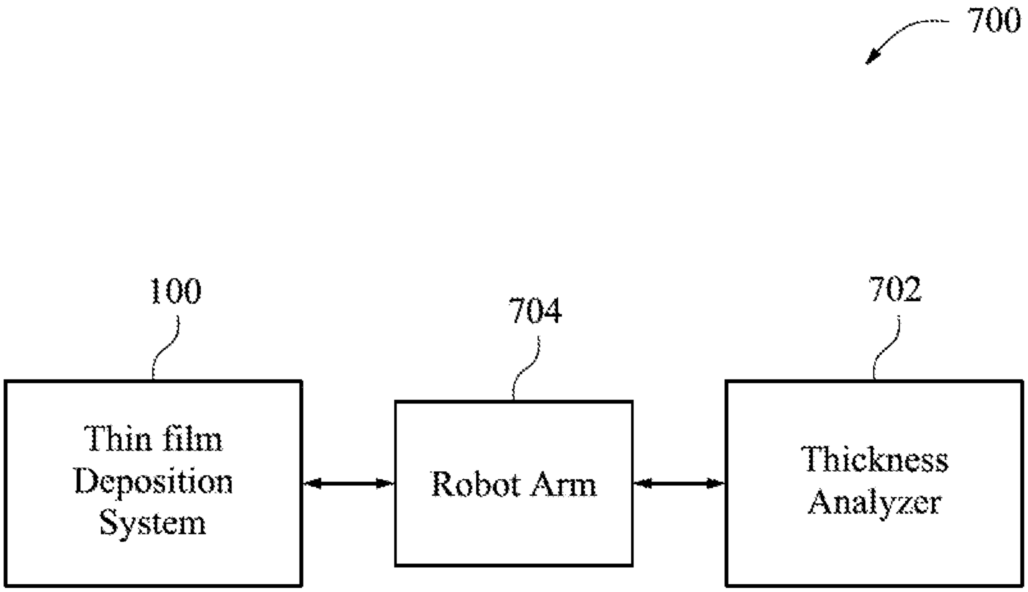
FIG. 7 is a block diagram of a semiconductor process system, according to one embodiment.

FIG. 7 is a block diagram of a semiconductor process system 700, according to one embodiment. The semiconductor process system 700 includes a thin film deposition system 100, a thickness analyzer 702, and a robot arm 704. After the thin film deposition system 100 deposits the thin film 141 on the substrate 104, the robot arm 704 transfers the substrate 104 to the thickness analyzer 702. The thickness analyzer 702 measures the thickness of the thin film. The semiconductor process system 700 can determine whether the thin film deposition process passes or fails based on the thickness analyzer 702.

In one embodiment, the thickness analyzer 702 may include use of spectrometry to determine thicknesses of layers or coatings, such as an x-ray measurement device. In one example, the x-ray measurement device is an x-ray fluorescence measurement device. The x-ray measurement device bombards the thin film 141 with x-rays and measures the energy of radiation emitted by the thin film 141. The radiation emitted by the thin film 141 is indicative of the elements and compounds included in the thin film 141. Furthermore, the energy of the radiation emitted by the thin film 141 after absorption of x-rays is indicative of the thickness of the thin film.

In one embodiment, the thickness analyzer 702 is an optical thickness analyzer. The optical thickness analyzer can include an ellipsometer. The ellipsometer measures the polarization change in light reflected, absorbed, scattered, or emitted by the thin film 141. The change in polarization of the light gives an indication of the thickness of the thin film 141. Other types of thickness analyzers can be utilized to analyze the thickness of the thin film 141 without departing from the scope of the present disclosure.

Analyzing the thickness of the thin film 141 can give an indication of whether the thin film deposition process is functioning properly. If the thickness of the thin film 141 is not within the expected range, the thin film deposition process can be adjusted in order to generate a thin film 141 having desired characteristics. Accordingly, the thickness analyzer 702 can help to assure that the thin film deposition system 100 operates correctly in a timely manner.

Figure 8:
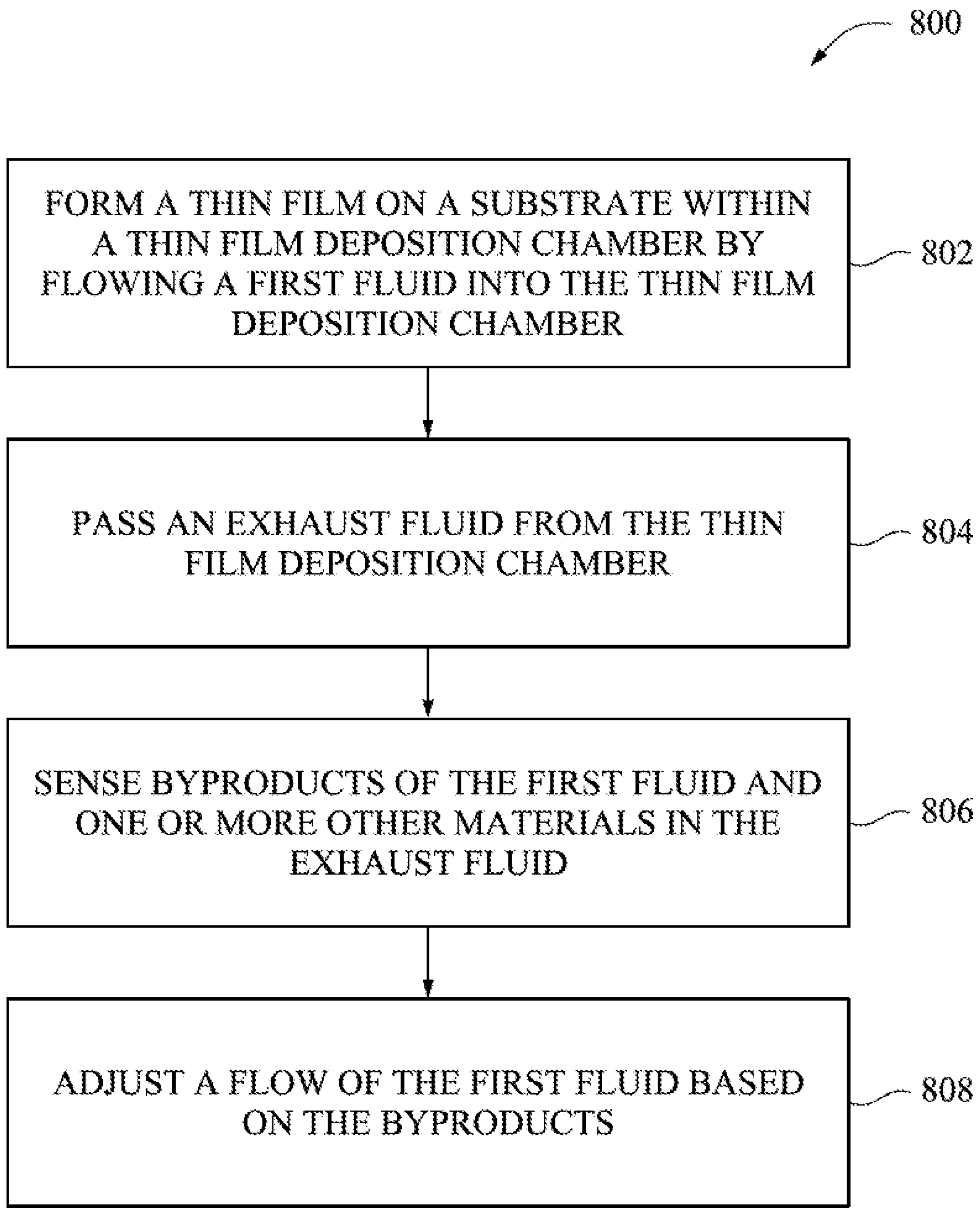
FIG. 8 is a flow diagram of a method for forming a thin film, according to one embodiment.

FIG. 8 is a flow diagram of a method 800 for depositing a thin film. At 802, the method includes forming a thin film on a substrate within a thin film deposition chamber by flowing a first fluid into the thin film deposition chamber. One example of a thin film is the thin films 141 of FIGS. 2B and 2C. One example of a thin film deposition chamber is the thin film deposition chamber 102 of FIG. 1. At 804, the method 800 includes passing an exhaust fluid from the thin film deposition chamber. At 806, the method 800 includes sensing byproducts of the first fluid and one or more materials in the exhaust fluid. At 808, the method 800 includes adjusting a flow of the first fluid based on the byproducts.

Figure 9:
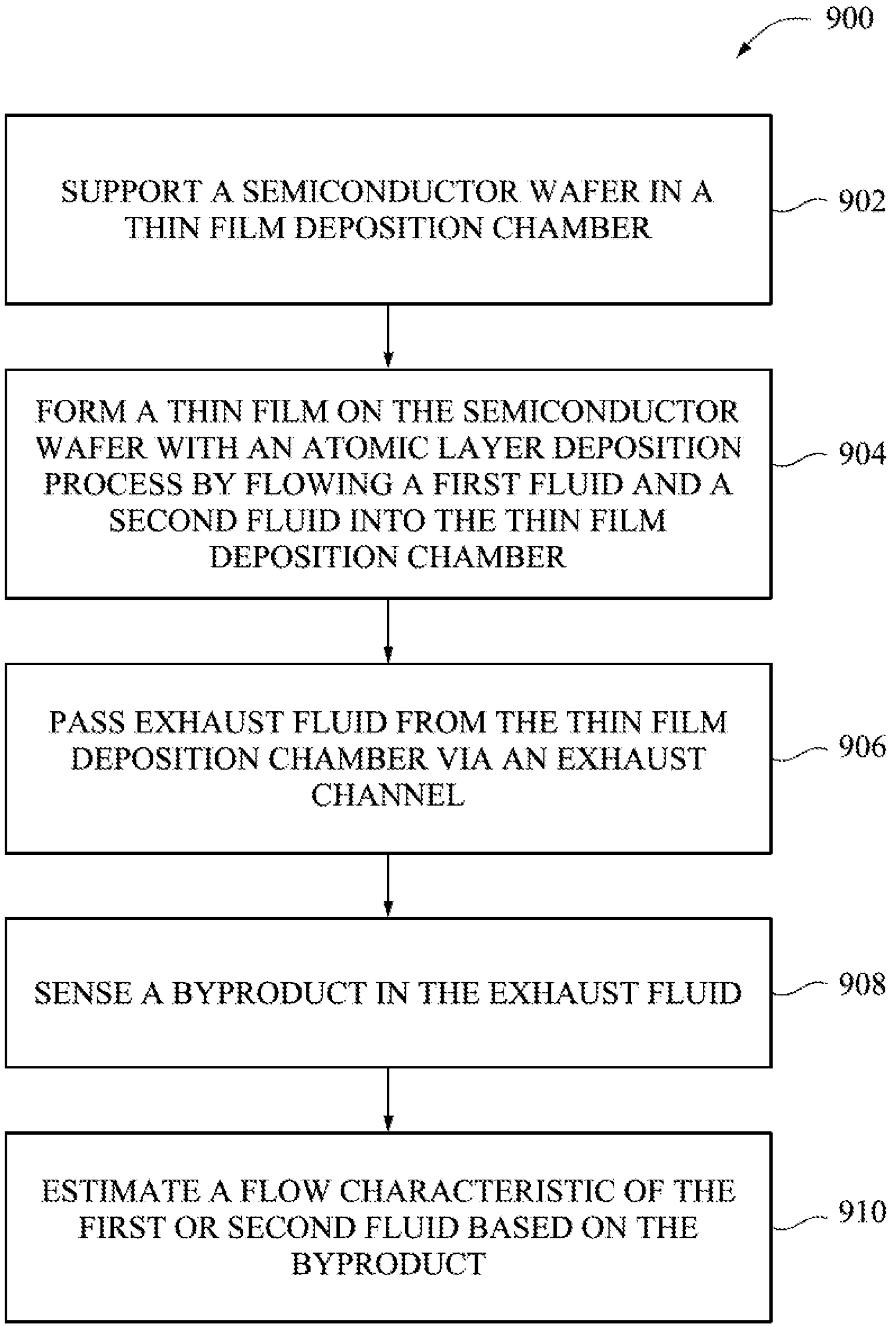
FIG. 9 is a flow diagram of a method for forming a thin film, according to one embodiment.

FIG. 9 is a flow diagram of a method 900 for depositing a thin film. At 902, the method 900 includes supporting a semiconductor wafer in a thin film deposition chamber. One example of a thin film deposition chamber is the thin film deposition chamber 102 of FIG. 1. At 904, the method 900 includes forming a thin film on the semiconductor wafer with an atomic layer deposition process by flowing a first fluid and a second fluid into the thin film deposition chamber. At 906, the method 900 includes passing exhaust fluid from the thin film deposition chamber via an exhaust channel. One example of an exhaust channel is the exhaust channel 120 of FIG. 1. At 908, the method 900 includes sensing a byproduct in the exhaust fluid. At 910, the method 900 includes estimating, a flow characteristic of the first or second fluid based on the byproduct.

In one embodiment, a thin film deposition system including a thin film deposition chamber and a support configured to support a substrate within the thin film deposition chamber. The system includes a first fluid source configured to provide a first fluid into the thin film deposition chamber during a thin film deposition process, an exhaust channel configured to pass an exhaust fluid from the thin film deposition chamber, and a byproduct sensor configured to sense byproducts in the exhaust fluid and to generate sensor signals indicative of the byproducts. The system includes a control system configured to receive the sensor signals and to adjust the thin film deposition process responsive to the sensor signals.

In one embodiment, a method incudes forming a thin film on a substrate within a thin film deposition chamber by flowing a first fluid into the thin film deposition chamber and passing an exhaust fluid from the thin film deposition chamber. The method includes sensing byproducts of the first fluid and one or more materials in the exhaust fluid and adjusting a flow of the first fluid based on the byproducts.

In one embodiment, a method includes supporting a semiconductor wafer in a thin film deposition chamber and forming a thin film on the semiconductor wafer with an atomic layer deposition process by flowing a first fluid and a second fluid into the thin film deposition chamber. The method includes passing exhaust fluid from the thin film deposition chamber via an exhaust channel, sensing a byproduct in the exhaust fluid, and estimating, a flow characteristic of the first or second fluid based on the byproduct.

Embodiments of the present disclosure provide thin films of reliable thickness and composition. Embodiments of the present disclosure accurately monitor the flow of deposition fluids during thin film deposition processes and adjust the flow of fluids in real time to ensure proper formation of the thin films. Embodiments of the present disclosure monitor the flow of the fluids by detecting byproducts of the deposition fluids in exhaust fluids flowing from the thin film deposition chamber. Embodiments of the present disclosure can also determine whether a deposition fluid source is empty or nearly empty and needs to be refilled or replaced.

The various embodiments described above can be combined to provide further embodiments. All U.S. patent application publications and U.S. patent applications referred to in this specification and/or listed in the Application Data Sheet are incorporated herein by reference, in their entirety. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:

supporting a semiconductor wafer in a thin film deposition chamber;

depositing a seed layer on a substrate, the seed layer including functionalized oxygen atoms;

forming, on the seed layer, a gate oxide layer of a transistor by performing a plurality of deposition cycles, each deposition cycle including:

flowing H2O into the chamber;

purging the H2O from the chamber in a first purging process including passing an exhaust fluid from the thin film deposition chamber;

flowing HfCl4 into the chamber after purging the H2O from the chamber; and purging the HfCl4 from the chamber in a second purging process;

passing an exhaust fluid from the thin film deposition chamber via a first channel, wherein the first channel is an exhaust channel;

drafting a portion of the exhaust fluid into a second channel;

generating, with a sensor in the second channel, sensor data indicative of a concentration of hydrogen ions or OH molecules in the exhaust fluid;

generating, with a control system coupled to the sensor, thickness data indicative of a thickness of the gate dielectric layer based on the concentration of hydrogen ions or OH molecules; and adjusting, with the control system responsive to the thickness data, a flow of the HfCl4.

2. The method of claim 1, further comprising sensing a pH of the exhaust fluid.

3. The method of claim 1, further comprising performing mass spectroscopy on the exhaust fluid.

4. The method of claim 1, further comprising:

sensing byproducts of the HfCl4 in the exhaust fluid.

5. The method of claim 4, further comprising forming the gate oxide layer with an atomic layer deposition process by selectively flowing the H2O and the HfCl4 into the thin film deposition chamber.

6. A method, comprising:

supporting a semiconductor wafer in a thin film deposition chamber;

forming a seed layer on the semiconductor substrate and including functionalized oxygen atoms;

forming, on the seed layer, a gate oxide layer of a transistor on the seed layer by performing an atomic layer deposition process performing a plurality of deposition cycles, each deposition cycle including:

flowing H2O into the chamber;

purging the H2O from the chamber in a first purging process including passing an exhaust fluid from the thin film deposition chamber;

flowing $HfCl_4$ into the chamber after purging the $H_2O$ from the chamber;

purging the $HfCl_4$ from the chamber in a second purging process;

passing exhaust fluid from the thin film deposition chamber via an exhaust channel via a first channel;

drafting a portion of the exhaust fluid into a second channel coupled to the exhaust channel generating, with a sensor in the second channel, sensor data by a concentration of hydrogen ions or OH molecules in the exhaust fluid;

generating, with a control system, a thickness data indicating a thickness of the thin film based on the concentration of hydrogen ions or OH molecules; and adjusting, with the control system responsive to the thickness data, the atomic layer deposition process.

7. The method of claim 6, further comprising determining a remaining amount of the $H_2O$ in a fluid source based on the byproduct.

8. The method of claim 6, wherein the sensor includes a mass flow controller.

9. The method of claim 6, wherein adjusting the atomic layer deposition process includes adjusting a flow of the $H_2O$.

10. The method of claim 9, wherein adjusting the atomic layer deposition process includes adjusting a flow of the $HfCl_4$.

11. A method, comprising:

forming, on a substrate within a thin film deposition chamber, a gate oxide layer of a transistor on a seed layer including functionalized oxygen by performing a plurality of deposition cycles, each deposition cycle including:

flowing $H_2O$ into the chamber;

purging the $H_2O$ from the chamber in a first purging process including passing an exhaust fluid from the thin film deposition chamber;

flowing $HfCl_4$ into the chamber after purging the $H_2O$ from the chamber; and purging the $HfCl_4$ from the chamber in a second purging process;

passing a first exhaust fluid from the thin film deposition chamber via a first channel;

drafting a portion of the first exhaust fluid into a second channel coupled to the exhaust channel;

generating, with a sensor in the second channel, sensor data indicative of a concentration of hydrogen ions or OH molecules in the exhaust fluid; and calculating, with the control system, a thickness of the oxide layer based on concentration of hydrogen ions or OH molecules in the exhaust fluid; and adjusting, by the control system, a flow rate of the $H_2O$ or $HfCl_4$ based on the thickness of the gate oxide layer.

12. The method of claim 11, further comprising drafting a second exhaust fluid into the second channel.

13. The method of claim 12, comprising:

analyzing, with the control system, byproducts in the second exhaust fluid; and increasing, with the control system, a flow rate of the HfCl responsive to analyzing the byproducts in the second exhaust fluid.

14. The method of claim 11, further comprising sensing a pH of the first exhaust fluid.

15. The method of claim 11, further comprising performing mass spectroscopy on the first exhaust fluid.

16. The method of claim 11, further comprising:

determining that a quantity of $H_2O$ in a fluid container is low based on the concentration of hydrogen ions or HO molecules; and increasing the flow rate of the $H_2O$ responsive to determining that the quantity of the $H_2O$ in the fluid container is low.

17. The method of claim 11, wherein forming the gate oxide layer includes performing an atomic layer deposition process.

18. The method of claim 11, comprising:

determining that a quantity of the $H_2O$ in a fluid container is low based on the concentration of hydrogen ions or HO molecules; and outputting, with the control system, an alert that the quantity of the $H_2O$ is low.

19. The method of claim 11, wherein the gate oxide layer is a high-K gate oxide layer.

20. The method of claim 19, wherein the gate oxide layer includes $Hf—OH_3$.

* * * * *